United States Patent
Beex et al.

(10) Patent No.: US 7,280,944 B1
(45) Date of Patent: Oct. 9, 2007

(54) MULTICHANNEL ADAPTIVE FILTER FOR NOISE AND/OR INTERFERENCE CANCELLATION

(75) Inventors: A. A. Louis Beex, Blacksburg, VA (US); James R. Zeidler, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 92 days.

(21) Appl. No.: 10/465,207

(22) Filed: Jun. 19, 2003

Related U.S. Application Data

(60) Provisional application No. 60/390,178, filed on Jun. 20, 2002.

(51) Int. Cl.
*G06F 19/00* (2006.01)
(52) U.S. Cl. ......................................... 702/191; 714/25
(58) Field of Classification Search ................ 702/191, 702/182–185, 188, 190, 116, 75–77; 324/512, 324/520, 521, 527, 532, 76.11, 76.13, 76.29; 714/25, 46
See application file for complete search history.

(56) References Cited

U.S. PATENT DOCUMENTS

2006/0217609 A1* 9/2006 Diab et al. .................. 600/336

OTHER PUBLICATIONS

Haykin, Simon S.; Adaptive Filter Theory/Simon Haykin—4th ed. p. cm ISBN 0-13090126-1 2002, p. 23.

* cited by examiner

*Primary Examiner*—Edward Raymond
(74) *Attorney, Agent, or Firm*—Pete A. Lipovsky; Allan Y. Lee; J. Eric Anderson

(57) ABSTRACT

A signal processing method comprises: a) detecting sample auxiliary signals from an auxiliary signal and sample reference signals from a reference signal at different times; b) applying an auxiliary weight from a set of auxiliary weights to a corresponding sample auxiliary signal to create weighted sample auxiliary signals; c) applying a reference weight from a set of reference weights to a corresponding sample reference signal to create weighted sample reference signals; d) creating a summation value that represents the sum of the weighted sample auxiliary signals and the weighted sample reference signals; e) creating an error signal that represents the difference between the desired signal and the summation value; f) scaling the error signal to generate an update function; g) detecting the error signal; h) applying the update function to each of the auxiliary weights and reference weights; and i) returning to step (a).

30 Claims, 4 Drawing Sheets

MULTICHANNEL ADAPTIVE FILTER FOR NOISE AND/OR INTERFERENCE CANCELLATION

CROSS-REFERENCES TO RELATED APPLICATIONS

This application claims the benefit of U.S. Provisional Application No. 60/390,178, filed 20 Jun. 2002, entitled "Multichannel Adaptive Filter for Noise and Interference Cancellation."

BACKGROUND OF THE INVENTION

For a number of years it has been noticed by a variety of researchers that adaptive filtering algorithms such as (Normalized) Least-Mean-Squares (NLMS) do not always behave as expected for the corresponding Wiener filter.

FIG. 1 illustrates a prior art adaptive filter that uses only one channel, the reference channel, that receives a reference signal $r_n$ as input to the linearly combining adaptive filter. The performance of such an adaptive filter, in a stationary environment, is well known and limited to the performance of a two-channel Wiener filter. The adaptive filter depicted in FIG. 1 also employs a primary signal $d_n$ in conjunction with the reference signal $r_n$ for determining an error signal $e_n$. However, the prior art adaptive filter, while possibly doing better than its Wiener filter counterpart, cannot generally achieve the limiting performance due to the time-varying nature of the optimal reference-only filter. Therefore, a need exists for an adaptive filter that can approach the limiting performance, and thereby overcome the limitations of prior art adaptive filters.

BRIEF DESCRIPTION OF THE DRAWINGS

Throughout the several views, like elements are referenced using like references.

SUMMARY OF THE INVENTION

A signal processing method comprises: a) detecting sample auxiliary signals from an auxiliary signal and sample reference signals from a reference signal at different times; b) applying an auxiliary weight from a set of auxiliary weights to a corresponding sample auxiliary signal to create weighted sample auxiliary signals; c) applying a reference weight from a set of reference weights to a corresponding sample reference signal to create weighted sample reference signals; d) creating a summation value that represents the sum of the weighted sample auxiliary signals and the weighted sample reference signals; e) creating an error signal that represents the difference between a desired signal and the summation value; f) scaling the error signal to generate an update function; g) detecting the error signal; h) applying the update function to each of the auxiliary weights and reference weights; and i) returning to step (a).

DESCRIPTION OF THE PREFERRED EMBODIMENT

Figure 2:
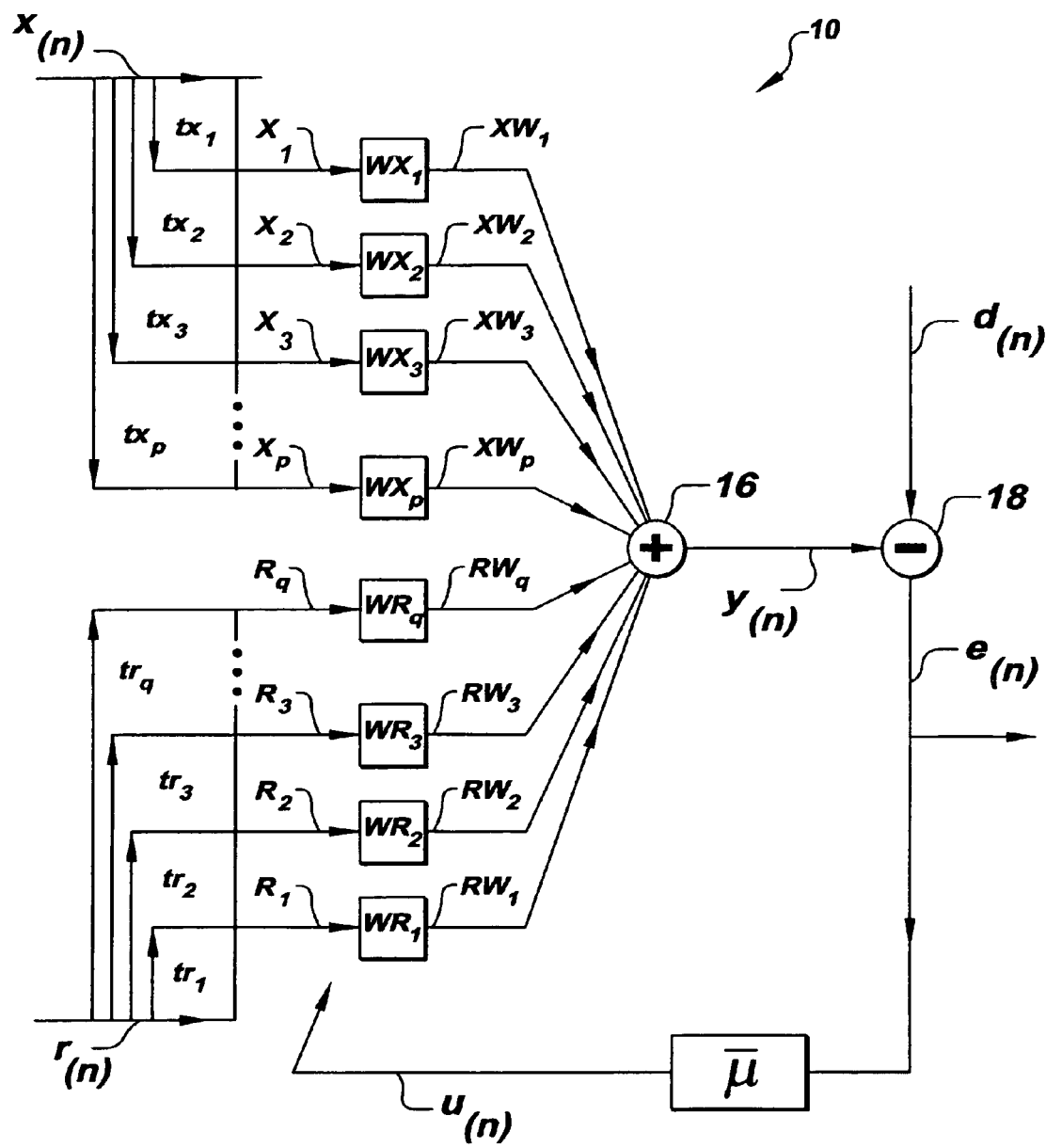
FIG. 2 is a schematic diagram of an adaptive filter that embodies various features of the present invention.

Referring to FIG. 2, there is shown an embodiment of a multi-channel adaptive filter 10, wherein a first set of p sample auxiliary signals $\{X_1, X_2, X_3, \ldots X_p\}$ are sampled from an auxiliary signal at different times $\{tx_1, tx_2, tx_3, \ldots tx_p\}$, respectively, where p is a positive integer. An auxiliary signal is an extra signal that contains useful information as described below. Next, for each of the p auxiliary weights from a set of auxiliary weights $\{WX_1, WX_2, WX_3, \ldots WX_p\}$, and for each of the sample auxiliary signals, one auxiliary weight $WX_i$ is applied to a corresponding auxiliary signal $X_i$ to create a set of corresponding weighted sample auxiliary signals $\{XW_1, XW_2, XW_3, \ldots XW_p\}$ for all i, where i is a positive integer and $i \leq p$. A first set of q sample reference signals $\{R_1, R_2, R_3, \ldots R_q\}$ are sampled at different times $\{tr_1, tr_2, tr_3, \ldots tr_q\}$, respectively, where q is a positive integer. For each of the q reference weights from a set of reference weights $\{WR_1, WR_2, WR_3, \ldots WR_q\}$, and for each of the sample reference signals, one reference weight $WR_k$ is applied to a corresponding sample reference signal $R_k$ to create a set of corresponding weighted sample reference signals $\{RW_1, RW_2, RW_3, \ldots RW_q\}$ for all k, where k is a positive integer and $k \leq q$. The reference signal r(n) has components that are characteristic of the desired signal d(n) that is employed by filter 10 as described below. The desired signal generally is comprised of a signal of interest, as well as noise and/or interference components that are to be eliminated, or at least attenuated so that the signal of interest may be discerned. The reference signal may be used to provide increasingly improved estimations of the signal of interest. An accumulation sum y(n) is determined at summing node 16, where:

$$y(n) = \{XW_1 + XW_2 + XW_3 + \ldots + XW_p\} + \{RW_1 + RW_2 + RW_3 + \ldots + RW_q\}.$$

An error signal e(n) is created at difference node 18, where: e(n)=d(n)−y(n).

Next, the error signal e(n) is scaled by a scaling factor $\bar{\mu}$ to generate an update function U(n). The error signal e(n) may be detected at any time and represents the latest estimation of the signal of interest contained in the desired signal d(n) having reduced or eliminated distortion or interference components so as to approximately reveal the signal of interest. The update function U(n) is applied to each of the auxiliary weights $\{WX_1, WX_2, WX_3, \ldots WX_p\}$ and reference weights $\{WR_1, WR_2, WR_3, \ldots WR_q\}$ to facilitate ever more refined estimations of the actual signal of interest. The process represented in FIG. 2 may be repeated by applying the updated auxiliary weights $\{WX_1, WX_2, WX_3, \ldots WX_p\}$ and updated reference weights $\{WR_1, WR_2, WR_3, \ldots WR_q\}$ to more recent samples of the auxiliary signal x(n) and reference signal r(n), respectively.

In one embodiment, the sample auxiliary signals $\{X_1, X_2, X_3, \ldots X_p\}$ may be sequentially detected at fixed time intervals $t_A$ from a reference time, $\tau_1$. Similarly, the sample reference signals $\{R_1, R_2, R_3, \ldots R_q\}$ may be sequentially detected at fixed time intervals $t_B$ from a reference time, $\tau_2$. In one embodiment, $t_A = t_B$. However, the scope of the invention also includes the case where $t_A \neq t_B$, the case where $\tau_1 = \tau_2$, and the case where $\tau_1 \neq \tau_2$. In another embodiment wherein the adaptive filter 10 is used in a noise cancelling mode, the auxiliary signal derives from past samples of the desired signal, where the desired signal includes a signal of interest that is to be estimated by adaptive filter 10. In the equalizer mode, the auxiliary signal represents an estimation of the non-measurable interference contained in the reference signal, and may further include interference and/or noise components. In the noise cancelling mode of operation of the adaptive filter 10, the reference signal r(n) is related to the desired signal d(n) because they share common characteristics and are statistically related. For example, the reference signal r(n) and desired signal d(n) may derive from the same source. In another embodiment, the desired signal and the auxiliary signal may be distinct signals. When operating adaptive filter 10 in a training mode, the desired signal may be a signal of interest, the reference signal r(n) may be a measured, or detected signal, and the auxiliary signal x(n) may represent an estimate of the interference component contained in the reference signal r(n). The training mode allows the adaptive filter 10 to "learn" the characteristics of the signal of interest, noise, and interference contained in the reference signal so that the adaptive filter 10 optimally discriminates the signal of interest.

The auxiliary weights $\{WX_1, WX_2, WX_3, \ldots WX_p\}$ and reference weights $\{WR_1, WR_2, WR_3, \ldots WR_q\}$ may be updated in accordance with an update function U(n). In one embodiment, when operating adaptive filter 10 in a normalized least mean square mode (NMLS), the update function U(n) may be defined as follows:

$$U(n) = \bar{\mu} \frac{e_n^*}{|X_1|^2 + \cdots |X_p|^2 + |R_1|^2 + \cdots |R_q|^2},$$

where $e_n^*$ represents the conjugate of the error signal $e_n$; $WX_j$ is replaced by $WX_j + U(n) \cdot X_j$; j=1, ..., p; and $WR_k$ is replaced by $WR_k + U(n) \cdot R_k$; k=1, ..., q. In such case $\bar{\mu}$ is a scaling factor such that $0 < \bar{\mu} \leq 1$. In another embodiment, when operating adaptive filter 10 in a least mean square (LMS) mode, the update function may be defined as follows: $U(n) = \bar{\mu} \cdot e_n^*$, where $WX_j$ is replaced by $WX_j + U(n) \cdot X_j$; j=1, ..., p; and $WR_k$ is replaced by $WR_k + U(n) \cdot R_k$; k=1, ..., q. In such case, $\bar{\mu} > 0$. Although two examples of update functions are presented herein, it is to be understood that the scope of the invention includes the implementation of any suitable update function that satisfies end-user requirements.

Figure 3:
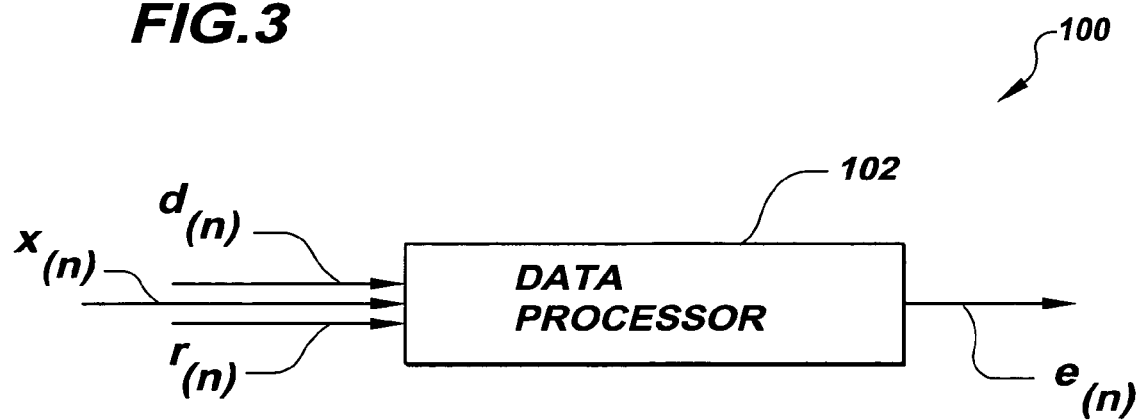
FIG. 3 shows a system that includes a processor for implementing an adaptive filter in accordance with various features of the present invention.

As shown in FIG. 3, one embodiment of the invention may be implemented as an adaptive filter system 100 that includes a data processor 102 such as, for example, as a personal computer, computer, microprocessor, field programmable gate array (FPGA), an analog device, and any other device capable of implementing the process described above with reference to FIG. 2. In response to receiving a desired signal d(n), an auxiliary signal x(n), and a reference signal r(n), data processor 102 executes a sequence of computer readable instructions that implements the process described above with reference to FIG. 2. The output of computer 102 is error signal e(n) that represents an estimate of the signal of interest contained in the desired signal d(n). When implemented as a computer or personal computer, the data processor 102 executes a sequence of computer readable instructions that result in effectuation of the process described above with reference to FIG. 2.

Figure 4:
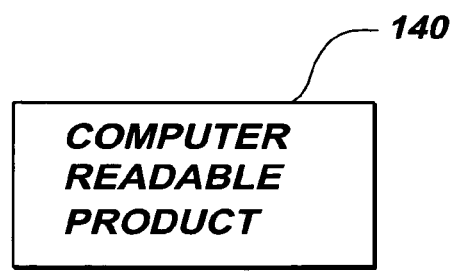
FIG. 4 shows a computer readable medium on which computer readable program code is embodied for causing a computer to perform adaptive filter processing that embodies various features of the present invention.

In FIG. 4 there is shown a representation of a computer program product 140 on which is encoded a sequence of computer executable instructions which, when implemented by a computer, cause the computer to perform the process described above with reference to FIG. 2. Computer program product 140 may be implemented as a magnetic medium such as diskettes, zip disks, tape, or as an optical medium, such as compact discs, optical discs, and the like. More generally computer program product 140 may be implemented as any medium in which a sequence of computer executable instructions may be recorded for determining an error signal e(n) that represents an estimate of the signal of interest contained in the desired signal d(n).

Figure 1:
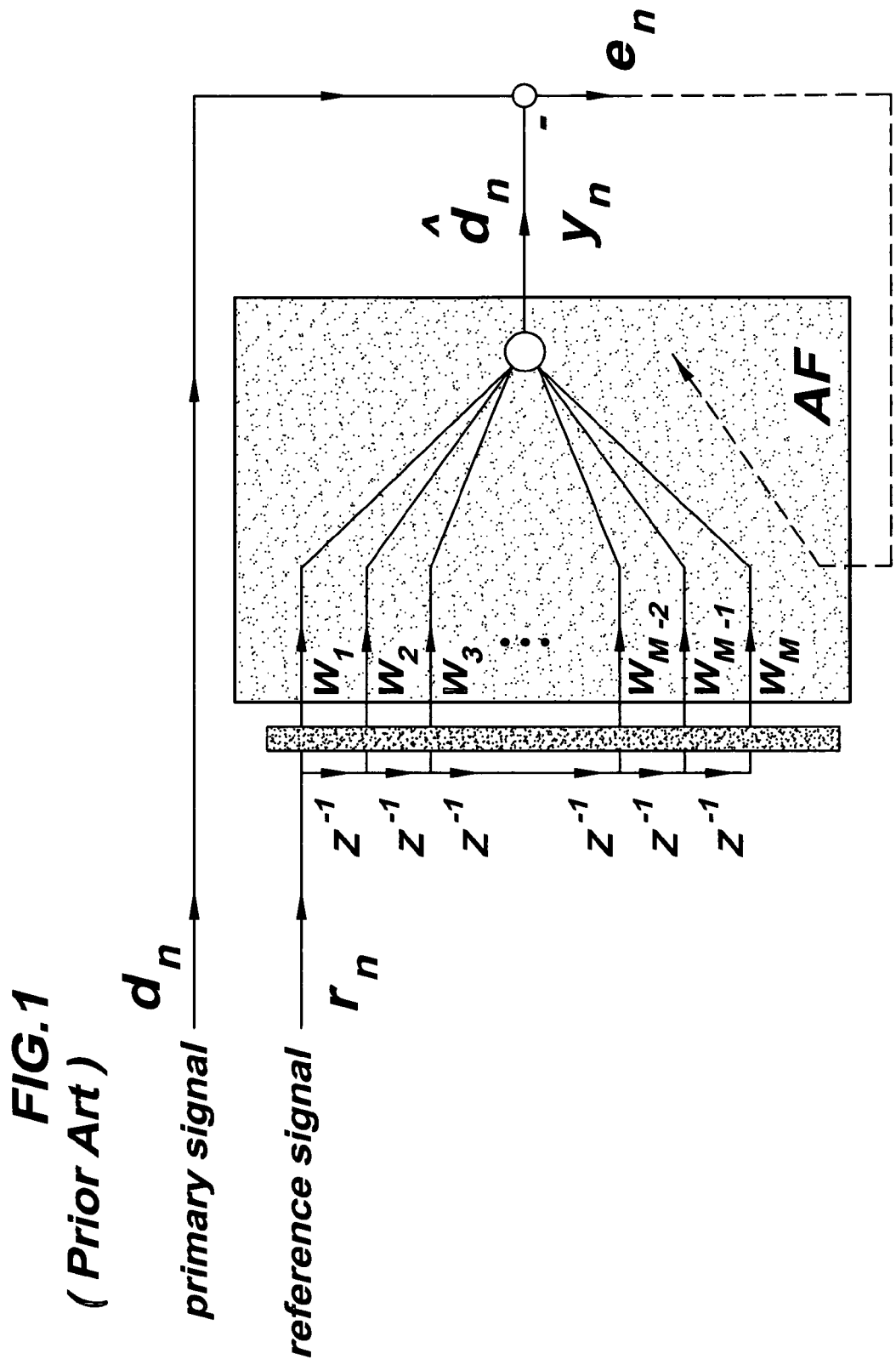
FIG. 1 is a schematic diagram of a prior art adaptive filter that uses a single input channel.
Figure 5:
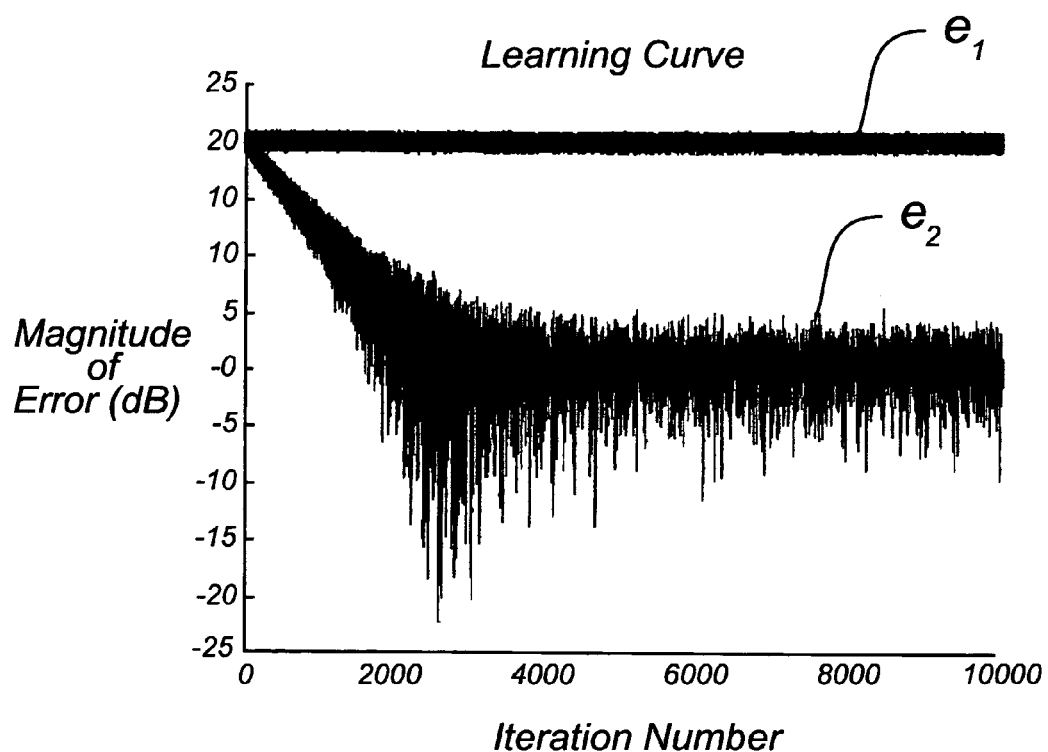
FIG. 5 shows a performance comparison between a prior art, single-channel adaptive filter and a multi-channel adaptive filter that embodies various features of the present invention.

APPENDIX 1 is an embodiment of computer program listing which was written, by way of example, in Matlab, for causing a sequence of computer executable instructions to be executed by a computer. Upon reading the instruction, the computer implements both the prior art adaptive filter depicted in FIG. 1, and the interference cancelling embodiment of the multi-channel adaptive filter 10 described above with reference to FIG. 2. The inputs to both the prior art adaptive filter and the multi-channel adaptive filter 10 are numerical representations of a desired signal d(n), a reference signal r(n), and an auxiliary signal x(n) that represents the past of the desired signal. The desired signal consists of the signal of interest combined with an interference sinusoid component, and a noise component, where the signal-to-interference ratio (SIR) is about −20 dB, and the signal-to-noise ratio is equal to about 20 dB. The reference signal is a Doppler-shifted sinusoid that is slightly offset in frequency from the interference component. For the specific example described above, the multi-channel adaptive filter 10 recognized the symbols of the signal of interest with a low symbol-error-rate (SER), whereas the prior art, single-channel adaptive filter produced a symbol-error-rate on par with taking random guesses. In the above-referenced computer program the symbols are represented by the complex numbers (1+j), (1−j), (−1+j), and (−1−j). Each of these complex numbers can represent two binary digits. By way of example, but without limitation, (1+j) may represent "00," (1−j) may represent "10," (−1+j) may represent "01," and (−1−j) may represent "1,1." As a result, the symbols are used in the simulation of a baseband digital communication channel, subject to strong narrowband interference and noise. Averaging the results from 10 independent runs of the computer program listed in APPENDIX 1 resulted in an SER equal to 0.7158 for the prior art, single-channel adaptive filter, and an SER equal to 0.0021 for the multi-channel adaptive filter 10. FIG. 5 shows that using the inputs described above, the prior art, reference-only adaptive filter cannot make its error signal $e_1$ very small, while the multi-channel adaptive filter 10 that embodies various features of the present invention is able to make its error signal $e_2$ very small relative to $e_1$. FIG. 5 further shows that for iterations above about 3,000 ($n \geq 3,000$), the multi-channel adaptive filter 10 is in essentially a steady-state operation.

Obviously, many modifications and variations of the adaptive filter described herein are possible in light of the above teachings. It is therefore to be understood that within the scope of the appended claims, the invention may be practiced otherwise than as specifically described.

APPENDIX 1

```
% MCANC.m
% multi-channel ANC scenario for QPSK under sinusoidal
interference
% by AAB 6/12/03 -
%
NoOfData = 10000 ; % Set no of data points used
%NoOfData = 20000 ;
ssint = 1000 ; % set steady-state interval
%ssint = NoOfData ;
Order = 10 ;    % Set the NLMS adaptive filter order(s)
Mu = .001 ;    % Set the NLMS step-size constant
PLOT = 1 ; %plot results
%PLOT = 0 ; % no plotting
PLOTweights = 1 ; % plot weight behavior
t = [1:NoOfData];
maxitn = 10 ;
if maxitn>1, PLOT = 0 ; end ;
for itn=1:maxitn,
    if itn>1, close all; end ;
qpsk = sign(randn(NoOfData,2))*[1 ; j] ; % SOI (signal-of-
interest) is baseband QPSK
sq2 = sqrt(2) ;
qpsk = qpsk./sq2 ; % normalize variance to 1
SIR = −20 ; % set signal-to-interference ratio (in dB), in
theory
SNR = 20 ; % set signal-to-noise ratio (in dB), in theory
Aint = 1 ;
thetai = rand(1)*2*pi ;
fi = (pi/3)/2/pi ;
int = Aint*exp(j*(2*pi*fi*t+thetai)); % generate exponential
interference signal
fac = sqrt(10^(−SIR/10)) ;
int = fac*int ;
Aref = 3 ;
thetar = rand(1)*2*pi ;
fr = fi+.01*2*pi/2/pi ; % reference signal is related to
interference signal (by Doppler shift)
ref = Aref*exp(j*(2*pi*fr*t+thetar)) ; % exponential reference
signal
%ref = Aref*exp(j*(2*pi*fi*t+thetar)) ; % exponential reference
signal
noi = randn(1,NoOfData) +j*randn(1,NoOfData) ;
noi = noi/sqrt(2) ; % normalize noise energy to 1, before
setting SNR
cnoi = sqrt(10^(−SNR/10)) ; % find scaling to set SNR to
desired value
noise = cnoi*noi ;
d = qpsk+int+noise; % desired signal = signal-of-interest +
interference
% so that reference signal is also related to the desired
signal
r = ref ;
SIRdata = 10*LOG10(var(qpsk)/var(int)) % verify SIR from actual
signals
SNRdata = 10*log10(var(qpsk)/var(noise)) % verify SNR from
actual signals
% Initialize NLMS
w1 = zeros(Order,1) ; % weights for reference channel filter
w2 = zeros(2*Order,1) ; % weights for multi-channel filter
w1ss = zeros(Order,ssint) ;
w2ss = zeros(2*Order,ssint) ;
ssind = 1 ;
% NLMS Adaptation
offset = 10 ; % to start processing with filled arrays
for n = Order+offset NoOfData
    % reference-only NLMS follows
    u1 = r(n:−1:n−Order+1).' ;
    dhat1 = w1'*u1 ;
    y1(n) = dhat1 ;
    e1(n) = d(n) − dhat1 ;
    w1 = w1 + Mu*e1(n)'*u1/(u1'*u1) ;
    % reference-only NLMS ends
    % multichannel NLMS follows
    u2 = [d(n−1:−1:n−Order).' ; u1] ;
    dhat2 = w2'*u2 ;
    y2(n) = dhat2 ;
    e2(n) = d(n) − dhat2 ;
    w2 = w2 + Mu*e2(n)'*u2/(u2'*u2) ;
    % multi-channel NLMS ends
```

APPENDIX 1-continued

```
    % save weight information during steady-state interval only
    (takes too much time&storage otherwise)
        if (n>=NoOfData+1−ssint) & (n<=NoOfData),
            w1ss(:,n) = w1 ;
            w2ss(:,n) = w2 ;
            ssind = ssind+1 ;
        end;
    end ;
    if PLOT==1, % Plot results
    figure ; hold on ;
    plot (20*log10(abs(e1)),'r') ;
    plot (20*log10(abs(e2)),'b') ;
    hold off ;
    legend('e1','e2',1) ;
    title('Learning Curve') ;
    xlabel('Iteration Number') ;
    ylabel('|Error| (dB)') ;
    zoom on ;
    figure ;
    hold on ;
    plot(real(qpsk), 'g') ;
    plot(real(e1),'r:x') ;
    plot(real(e2),'b:s') ;
    legend('Re(QPSK)','Re(e1)','Re(e2)',1) ;
    hold off ;
    title('ANC scenario') ;
    xlabel ('sample') ;
    zoom on ;
    figure ;
    hold on ;
    plot(imag(qpsk),'g') ;
    plot(imag(e1),'r:x') ;
    plot(imag(e2),'b:s') ;
    legend('Im(QPSK)','Im(e1)','Im(e2)',1) ;
    hold off ;
    title('ANC scenario') ;
    xlabel('sample') ;
    zoom on ;
    ss = NoOfData−ssint+1:NoOfData ;
    if PLOTweights==1,
    figure;
    hold on ;
    plot(Order+1:2*Order,real(w1ss(:,ss)),'r') ;
    plot(real(w2ss(:,ss)),'b') ;
    hold off ;
    title('weight distribution over time at index - real');
    xlabel ('weight index');
    zoom on ;
    figure;
    hold on ;
    plot(Order+1:2*Order,imag(w1ss(:,ss)),'r') ;
    plot(imag(w2ss(:,ss)),'b') ;
    hold off ;
    title('weight distribution over time at index - imaginary');
    xlabel ('weight index');
    zoom on ;
    end ; % end weight plotting
    end ; %end all plotting
    is = 1:NoOfData ;
    ANC2SER ; % computes SER (symbol-error-rate) over entire data
    set
    SER(itn,1:2) = [SER1 SER2] ;
    is = NoOfData−ssint:NoOfData ;
    ANC2SER ; % computes SER over steady-state interval
    SER(itn,3:4) = [SER1 SER2] ;
    [itn SER(itn,:)]
    end ; % end iteration
    % compute spectra of error signals
    NPZ = 8*2^fix(log2(NoOfData)) ;
    %ffind = 1:NPZ/2+1 ;
    ffind = 1:NPZ;
    win = ones(1,length(is)) ;
    win = blackman(length(is)) ; win = win.' ;
    [spece1,ff] = freqz(win.*e1(is),1,NPZ,'whole',1) ;
    figure ;
    plot(ff(ffind),20*log10(abs(spece1(ffind))),'b-') ;
    title('spectrogram of e1') ;
    xlabel('fractional frequency') ;
    [spece2,ff] = freqz(win.*e2(is),1,NPZ,'whole',1) ;
```

APPENDIX 1-continued

```
figure ;
plot(ff(ffind),20*log10(abs(spece2(ffind))),'b-') ;
title('spectrogram of e2') ;
xlabel('fractional frequency') ;
```

We claim:

1. A method for filtering a signal, comprising the steps of:
   a) detecting a first set of p sample auxiliary signals $\{X_1, X_2, X_3, \ldots X_p\}$ from an auxiliary signal at different times, where p is a positive integer, and n represents a positive integer index;
   b) applying one auxiliary weight $WX_i$ from a set of auxiliary weights $\{WX_1, WX_2, WX_3, \ldots WX_p\}$ to a corresponding sample auxiliary signal $X_i$ to create a set of weighted sample auxiliary signals $\{XW_1, XW_2, XW_3, \ldots XW_p\}$ for all i, where i is a positive integer and $i \leq p$;
   c) detecting a first set of q sample reference signals $\{R_1, R_2, R_3, \ldots R_q\}$ from a reference signal at different times, where q is a positive integer;
   d) applying one reference weight $WR_k$ from a set of reference weights $\{WR_1, WR_2, WR_3, \ldots WR_q\}$ to a corresponding sample reference signal $R_k$ to create a set of weighted sample reference signals $\{RW_1, RW_2, RW_3, \ldots RW_q\}$ for all k, where k is a positive integer and $k \leq q$;
   e) creating a sum y(n), where $$y(n) = \{XW_1 + XW_2 + XW_3, \ldots + XW_p\} + \{RW_1 + RW_2 + RW_3, \ldots + RW_q\};$$

f) creating an error signal e(n), where e(n)=d(n)−y(n), where d(n) represents a desired signal;
   g) scaling said error signal to generate an update function U(n);
   h) detecting said error signal;
   i) applying said update function to each of said auxiliary weights $\{WX_1, WX_2, WX_3, \ldots WX_p\}$ and to said reference weights $\{WR_1, WR_2, WR_3, \ldots WR_q\}$; and
   j) returning to said step (a).

2. The method of claim 1 wherein said sample auxiliary signals $\{X_1, X_2, X_3, \ldots X_p\}$ are sequentially detected at fixed intervals from a reference time, $\tau_1$.

3. The method of claim 1 wherein said sample reference signals $\{R_1, R_2, R_3, \ldots R_q\}$ are sequentially detected at fixed intervals from a reference time, $\tau_2$.

4. The method of claim 1 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $$U(n) = \bar{\mu} \frac{e_n^*}{|X_1|^2 + \cdots |X_p|^2 + |R_1|^2 + \cdots |R_q|^2},$$

where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

5. The method of claim 1 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $U(n) = \bar{\mu} \cdot e_n^*$, where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

6. The method of claim 1 wherein said desired signal and said auxiliary signal are the same signal.

7. The method of claim 1 wherein said desired signal and said auxiliary signal are the same signal.

8. The method of claim 1 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $U(n) = \bar{\mu} \cdot e_n^*$, where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

9. The method of claim 1 wherein said desired signal and said auxiliary signal are different signals.

10. The computer program product of claim 9 wherein said sample auxiliary signals $\{X_1, X_2, X_3, \ldots X_p\}$ are sequentially detected at fixed intervals from a reference time, $\tau_1$.

11. The computer program product of claim 9 wherein said sample reference signals $\{R_1, R_2, R_3, \ldots R_q\}$ are sequentially detected at fixed intervals from a reference time, $\tau_2$.

12. The computer program product of claim 9 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $$U(n) = \bar{\mu} \frac{e_n^*}{|X_1|^2 + \cdots |X_p|^2 + |R_1|^2 + \cdots |R_q|^2},$$

where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

13. The computer program product of claim 9 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $U(n) = \bar{\mu} \cdot e_n^*$, where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

14. The computer program product of claim 9 wherein said desired signal and said auxiliary signal are the same signal.

15. The method of claim 9 wherein said desired signal and said auxiliary signal are different signals.

16. The adaptive filter of claim 9 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $U(n) = \bar{\mu} \cdot e_n^*$, where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; $k=1, \ldots, q$.

17. An adaptive filter, comprising:
   a data processor for executing the steps of:
   a) detecting a first set of p sample auxiliary signals $\{X_1, X_2, X_3, \ldots X_p\}$ from an auxiliary signal at different times, where p is a positive integer;
   b) applying one auxiliary weight $WX_i$ from a set of auxiliary weights $\{WX_1, WX_2, WX_3, \ldots WX_p\}$ to a sample auxiliary signal $X_i$ to create a set of weighted sample auxiliary signals $\{XW_1, XW_2, XW_3, \ldots XW_p\}$ for all i, where i is a positive integer and $i \leq p$;

c) detecting a first set of q sample reference signals $\{R_1, R_2, R_3, \ldots R_q\}$ from a reference signal at different times, where q is a positive integer;

d) applying a reference weight $WR_k$ from a set of reference weights $\{WR_1, WR_2, WR_3, \ldots WR_q\}$ to a corresponding sample reference signal $R_k$ to create a set of weighted sample reference signals $\{RW_1, RW_2, RW_3, \ldots RW_q\}$ for all k, where k is a positive integer and $k \leq q$;

e) creating a sum y(n), where $$y(n) = \{XW_1 + XW_2 + XW_3, \ldots + XW_p\} + \{RW_1 + RW_2 + RW_3, \ldots + RW_q\};$$

f) creating an error signal e(n), where e(n)=d(n)−y(n), where d(n) represents a desired signal;

g) scaling said error signal to generate an update function U(n);

h) detecting said error signal;

i) applying said update function to each of said auxiliary weights $\{WX_1, WX_2, WX_3, \ldots WX_p\}$ and to said reference weights $\{WR_1, WR_2, WR_3, \ldots WR_q\}$; and j) returning to said step (a).

18. The adaptive filter of claim 17 wherein said sample auxiliary signals $\{X_1, X_2, X_3, \ldots X_p\}$ are sequentially detected at fixed intervals from a reference time, $\tau_1$.

19. The adaptive filter of claim 17 wherein said sample reference signals $\{R_1, R_2, R_3, \ldots R_q\}$ are sequentially detected at fixed intervals from a reference time, $\tau_2$.

20. The adaptive filter of claim 17 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $$U(n) = \overline{\mu} \frac{e_n^*}{|X_1|^2 + \cdots |X_p|^2 + |R_1|^2 + \cdots |R_q|^2},$$

where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; k=1, ..., q.

21. The adaptive filter of claim 17 wherein said desired signal and said auxiliary signal are the same signal.

22. The adaptive filter of claim 17 wherein said desired signal and said auxiliary signal are different signals.

23. The adaptive filter of claim 17 wherein said data processor is selected from the group that includes a personal computer, microprocessor, and a field programmable gate array.

24. The adaptive filter of claim 17 wherein said steps are implemented by a sequence of computer readable instructions.

25. An adaptive filter, comprising:

first means for detecting a first set of p sample auxiliary signals $\{X_1, X_2, X_3, \ldots X_p\}$ from an auxiliary signal at different times;

second means for applying one auxiliary weight $WX_i$ from a set of auxiliary weights $\{WX_1, WX_2, WX_3, \ldots WX_p\}$ to a corresponding sample auxiliary signal $X_i$ to create a set of weighted sample auxiliary signals $\{XW_1, XW_2, XW_3, \ldots XW_p\}$ for all i, where i is a positive integer and $i \leq p$;

third means for detecting a first set of q sample reference signals $\{R_1, R_2, R_3, \ldots R_q\}$ from a reference signal at different times, where q is a positive integer;

fourth means for applying one reference weight $WR_k$ from a set of reference weights $\{WR_1, WR_2, WR_3, \ldots WR_q\}$ to a corresponding sample reference signal $R_k$ to create a set of weighted sample reference signals $\{RW_1, RW_2, RW_3, \ldots RW_q\}$ for all k, where k is a positive integer and $k \leq q$;

fifth means for creating a sum y(n), where $$y(n) = \{XW_1 + XW_2 + XW_3, \ldots + XW_p\} + \{RW_1 + RW_2 + RW_3, \ldots + RW_q\};$$

sixth means for creating an error signal e(n), where e(n)=d(n)−y(n), where d(n) represents a desired signal;

seventh means for scaling said error signal to generate an update function U(n);

eighth means for detecting said error signal;

ninth means for applying said update function to each of said auxiliary weights $\{WX_1, WX_2, WX_3, \ldots WX_p\}$ and to said reference weights $\{WR_1, WR_2, WR_3, \ldots WR_q\}$; and tenth means for returning to said first means.

26. The adaptive filter of claim 25 wherein said sample auxiliary signals $\{X_1, X_2, X_3, \ldots X_p\}$ are sequentially detected at fixed intervals from a reference time, $\tau_1$.

27. The adaptive filter of claim 25 wherein said sample reference signals $\{R_1, R_2, R_3, \ldots R_q\}$ are sequentially detected at fixed intervals from a reference time, $\tau_2$.

28. The adaptive filter of claim 25 wherein said auxiliary weights $\{WX_1, WX_2, WX_3, \ldots WX_p\}$ and said reference weights $\{WR_1, WR_2, WR_3, \ldots WR_q\}$ are updated in accordance with said update function U(n), where $$U(n) = \overline{\mu} \frac{e_n^*}{|X_1|^2 + \cdots |X_p|^2 + |R_1|^2 + \cdots |R_q|^2},$$

where $e_n^*$ represents a conjugate of said error signal $e_n$; $WX_j$ is replaced by $WX_j + U(n) \cdot X_j$; j is a positive integer index; $j \leq p$; and $WR_k$ is replaced by $WR_k + U(n) \cdot R_k$; k is a positive integer index; k=1, ..., q.

29. The adaptive filter of claim 25 wherein said desired signal and said auxiliary signal are the same signal.

30. The adaptive filter of claim 25 wherein said desired signal and said auxiliary signal are different signals.

* * * * *